United States Patent

Perner

(10) Patent No.: US 9,025,365 B2
(45) Date of Patent: May 5, 2015

(54) READING MEMORY ELEMENTS WITHIN A CROSSBAR ARRAY

(71) Applicant: Hewlett-Packard Development Company, L.P., Houston, TX (US)

(72) Inventor: Frederick Perner, Santa Barbara, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 198 days.

(21) Appl. No.: 13/899,283

(22) Filed: May 21, 2013

(65) Prior Publication Data

US 2014/0347910 A1 Nov. 27, 2014

Related U.S. Application Data

(62) Division of application No. 12/786,073, filed on May 24, 2010, now Pat. No. 8,647,253.

(51) Int. Cl.
G11C 11/16 (2006.01)
G11C 13/00 (2006.01)

(52) U.S. Cl.
CPC ................ G11C 13/004 (2013.01)

(58) Field of Classification Search
CPC .............. G11C 11/1673; G11C 2213/77
USPC ................ 365/148, 158, 163, 171, 173
See application file for complete search history.

(56) References Cited

U.S. PATENT DOCUMENTS

| | | | |
|---|---|---|---|
| 6,456,524 B1 | 9/2002 | Perner | |
| 6,839,270 B2 | 1/2005 | Perner et al. | |
| 6,891,768 B2 | 5/2005 | Smith et al. | |
| 7,372,753 B1 | 5/2008 | Rinerson et al. | |
| 7,505,344 B2 | 3/2009 | Scheuerlein | |
| 7,505,347 B2 | 3/2009 | Rinerson et al. | |
| 8,472,262 B2 * | 6/2013 | Perner | 365/189.05 |
| 8,570,785 B2 * | 10/2013 | Perner | 365/148 |
| 8,780,613 B1 * | 7/2014 | Perner | 365/148 |
| 2008/0090337 A1 | 4/2008 | Williams | |
| 2009/0027976 A1 | 1/2009 | Brewer et al. | |
| 2009/0168507 A1 | 7/2009 | Petti | |

\* cited by examiner

*Primary Examiner* — Harry W Byrne
*Assistant Examiner* — Lance Reidlinger
(74) *Attorney, Agent, or Firm* — Van Cott, Bagley, Cornwall & McCarthy

(57) ABSTRACT

A method for reading the state of a memory element within a crossbar memory array includes storing a first electric current sensed from a half-selected target memory element within the crossbar memory array; and outputting a final electric current based on the stored first electric current and a second electric current sensed from the target memory element when the target memory element is fully selected.

12 Claims, 6 Drawing Sheets

READING MEMORY ELEMENTS WITHIN A CROSSBAR ARRAY

CROSS-REFERENCE TO RELATED APPLICATION

The present application is a divisional application of Ser. No. 12/786,073, filed on May 24, 2010, now U.S. Pat. No. 8,647,253, issued on 18 Jun. 2013, the contents of which are incorporated herein by reference.

STATEMENT OF GOVERNMENT INTEREST

This invention has been made with government support under Contract No. HR0011-09-3-0001, awarded by the Defense Advanced Research Project Agency. The government has certain rights in the invention.

BACKGROUND

As the use of digital data increases, the demand for faster, smaller, and more efficient memory structures used for storing that digital data increases. One type of memory structure which has recently been developed is a crossbar memory structure. A crossbar memory structure includes a set of upper parallel wires which intersect a set of lower parallel wires. A programmable memory element is placed at the intersections between the upper and lower parallel lines. The programmable memory element may store digital data.

One type of programmable memory element which may be used is a memristive element. A memristive element is a device which changes the state of its resistance based on an applied programming condition. For example, a programming condition may be applied to change the memristive element from a high resistive state to a low resistive state or vice versa. A high resistive state may represent a digital "1" and a low resistive state may represent a digital "0".

One challenge that results from use of a crossbar memory structure is the process of reading the state of a specific memory element. The state of a memory element may be determined by applying a sensing condition such as a sense voltage or a sense electric current. The behavior of the sensing condition when applied to a memory element may be indicative of the current state of that memory element. However, when applying sensing conditions in such a manner, the sensing condition will be adversely affected by other memory elements along the upper wire and along the lower wire to which the memory element to be read is connected. Thus, it is difficult to isolate the memory element to be read from other memory elements within the crossbar array for the purpose of reading the state of the memory element.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
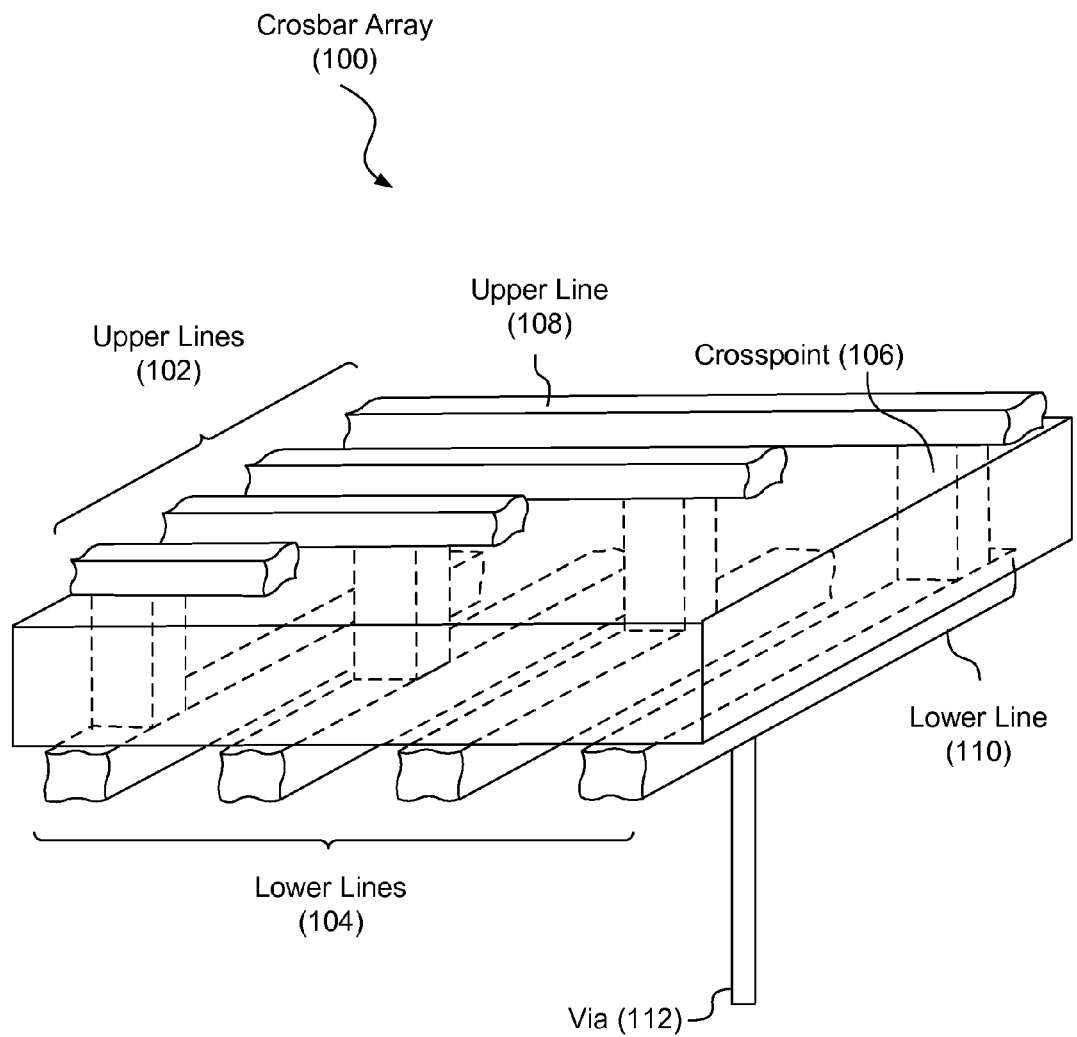
FIG. 1 is a diagram showing an illustrative crossbar array, according to one example of principles described herein.

As mentioned above, one challenge that results from use of a crossbar memory structure is the process of reading the state of a specific memory element. The state of a memory element may be determined by applying a sensing condition such as a sense voltage or a sense electric current. The behavior of the sensing condition when applied to a memory element may be indicative of the current state of that memory element. However, when applying sensing conditions in such a manner, the sensing condition will be adversely affected by other memory elements along the upper wire and lower wire to which the memory element to be read is connected. Thus, it is difficult to isolate the desired memory element from other memory elements within the crossbar array.

One solution has been to use isolation elements such as diodes and transistors which may selectively inhibit the flow of electric current from unselected memory elements. However, this approach requires the use of several additional electronic components for each memory element. Thus, the overall density of the memory array is decreased when using such isolation elements.

In light of these and other issues, the present specification discloses a method for accurately sensing the state of a target memory element without the need of such isolation elements. For purposes of illustration the two sets of intersecting parallel lines will be referred to as row lines and column lines. Either the row or column lines may be the upper or lower lines.

According to certain illustrative examples, a column line connected to a target memory element is selected. By selecting the column line, every memory element along the device becomes half-selected. The electric current flowing through the selected column line at this point is a result of bias voltages applied to the row lines intersecting the selected column line and is not indicative of the state of the target memory element. The electric current flowing from the selected column line at this point is stored in a storage element such as a sample and hold circuit.

After storing the electric current flowing from the selected column line, the target memory element may then be fully selected. To fully select the target memory element, a sense voltage is applied to the row line connected to the target memory element. By applying the sense voltage to the row line, all memory elements along that row line become half-selected except for the target memory element which is now fully selected. The electric current flowing from the column line is then again measured. The electric current measured and stored when the target memory element was only half-selected is then subtracted from the electric current sensed while the target memory element is fully selected. Thus, the ideal resulting final electric current value will include only the electric current from the target memory element.

A system or method embodying principles described herein allows the state of memory elements within a crossbar memory structure to be accurately read without the need of isolation elements. Thus, a memory structure having a higher density may be realized. Additionally, the cost of designing, implementing, and manufacturing such a memory structure may be reduced.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Throughout this specification and in the appended claims, the term "memory structure" is to be broadly interpreted as the physical structure of an electronic circuit designed to store digital data. A memory structure may include a number of programmable devices configured to be set to a number of different states.

Throughout this specification and in the appended claims, the term "crossbar array" is to be broadly interpreted as a number of lower wire segments configured to intersect a number of upper wire segments. A programmable logic device is disposed at each crosspoint between an upper wire segment and a lower wire segment.

Throughout this specification and in the appended claims, the term "memory element" is to be broadly interpreted as a component configured to be programmed with a value or state and maintain that value or state to be read at a later time.

Throughout this specification and in the appended claims, the terms "row lines" and "column lines" are used to differentiate between a first set of parallel lines intersecting a second set of parallel lines. Either the row or column lines may be the upper set of lines in any particular application.

Referring now to the figures, FIG. 1 is a diagram showing an illustrative crossbar memory architecture (100). According to certain illustrative examples, the crossbar architecture (100) may include an upper set of lines (102) which may generally be in parallel. Additionally, a lower set of lines (104) may be generally perpendicular to and intersect the upper lines (102). Programmable memory devices (106) are formed at the intersections between an upper line (108) and a lower line (110).

According to certain illustrative examples, the programmable memory devices (106) may be memristive devices. Memristive devices exhibit a "memory" of past electrical conditions. For example, a memristive device may include a matrix material which contains mobile dopants. These dopants can be moved within a matrix to dynamically alter the electrical operation of an electrical device.

The motion of dopants can be induced by the application of a programming condition such as an applied electrical voltage across a suitable matrix. The programming voltage generates a relatively high electrical field through the memristive matrix and alters the distribution of dopants. After removal of the electrical field, the location and characteristics of the dopants remain stable until the application of another programming electrical field. For example, by changing the dopant configurations within a memristive matrix, the electrical resistance of the device may be altered. The memristive device is read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles.

According to certain illustrative examples, the crossbar architecture (100) may be used to form a non-volatile memory array. Non-volatile memory has the characteristic of not losing its contents when no power is being supplied. Each of the programmable memory devices (106) is used to represent one or more bits of data. Although individual crossbar lines (108, 110) in FIG. 1 are shown with rectangular cross sections, crossbars may also have square, circular, elliptical, or more complex cross sections. The lines may also have many different widths, diameters, aspect ratios and/or eccentricities. The crossbars may be nanowires, sub-microscale wires, microscale wires, or wires with larger dimensions.

According to certain illustrative examples, the crossbar architecture (100) may be integrated into a Complimentary Metal-Oxide-Semiconductor (CMOS) circuit or other conventional computer circuitry. Each individual wire segment may be connected to the CMOS circuitry by a via (112). The via (112) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

Figure 2:
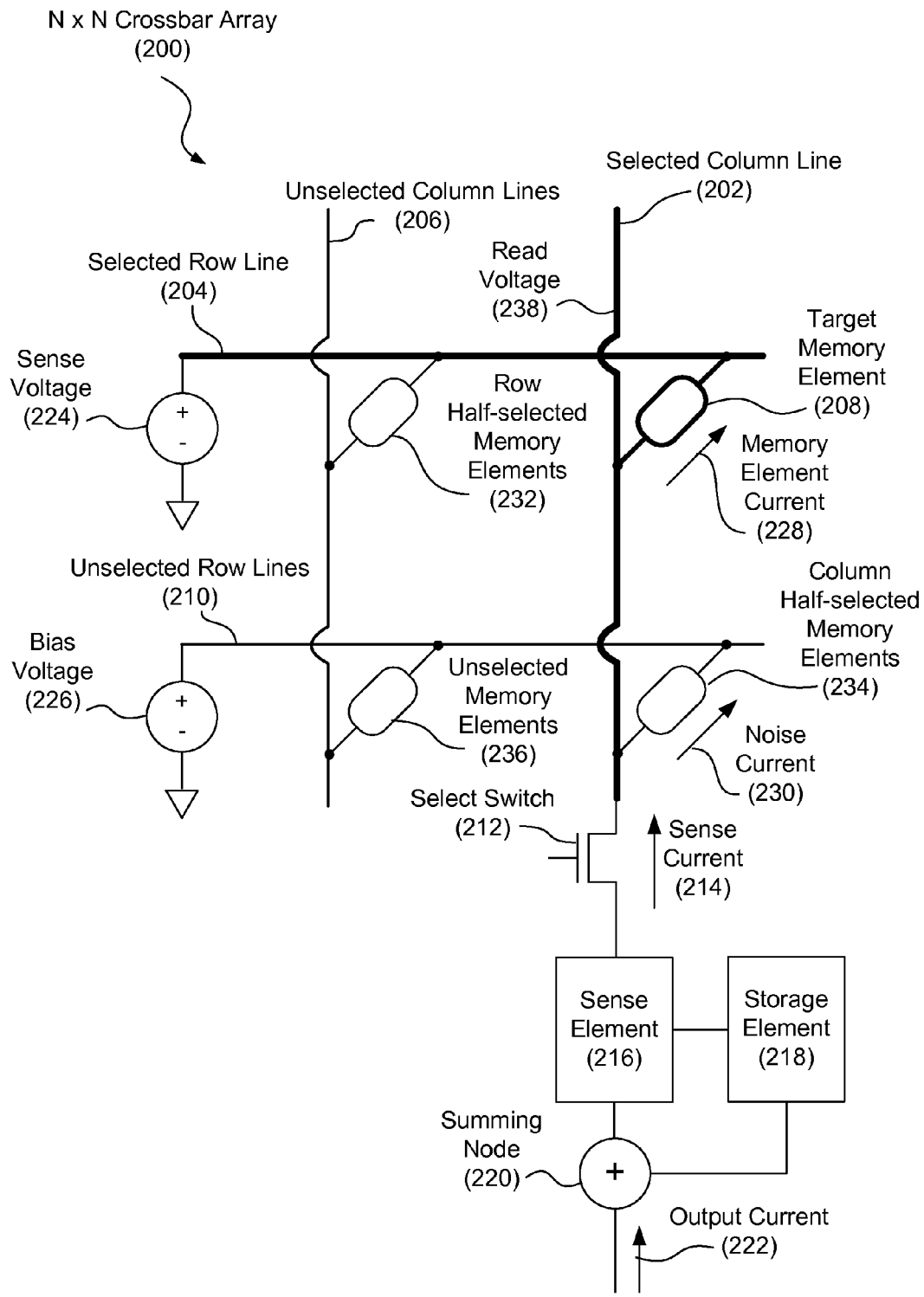
FIG. 2 is a diagram showing an illustrative model of an N×N crossbar array, according to one example of principles described herein.

FIG. 2 is a diagram showing an illustrative model of an N×N crossbar array (200). Although a practical crossbar array may include a 512×512 array, a simpler 2×2 array is shown for purposes of this discussion to more simply illustrate the principles of reading the state of memory elements within the array. It will be apparent to those skilled in the relevant art that the principles described below for the 2×2 model (200) may be applied to any practical array size.

According to one illustrative example, a target memory element (208) is selected by selecting a column line (202) connected to the target memory element (208) and selecting a row line (204) connected to the target memory element (208). A row line or column line may be selected by setting a select switch (212) attached to the row or column to an ON state. When a switch is in an ON state, electric current is allowed to flow through the switch. When a column line (202) becomes selected, a read voltage (238) forms on the selected column line (202).

Although many different switching devices may be used, the switching device shown in FIG. 2 is a Metal Oxide Semiconductor Field Effect Transistor (MOSFET) device. A MOSFET device either allows or inhibits the flow of electric current between the drain terminal and the source terminal depending on the signal received at the gate terminal. In the present configuration, the source terminal is connected to the upper line (202) and the drain terminal is connected to a sense element (216). The gate terminal may be connected to addressing circuitry used to select a particular memory element.

As mentioned above, when a column line (202) is selected, all of the memory elements (234) along that selected column line (202), including the target memory element (208) become half-selected. When the column line (202) becomes selected, an electric current will flow from the column line (202), across the select switch (212) and to the sense element (214). The electric current flowing from the column line may be referred to as the sense current (214).

The sense current (214) flowing from the column line (202) while the target memory element (208) is half-selected is resulting in part from any bias voltages (226) which are placed along the unselected row lines (210). The sense current (214) flowing from the column (202) line while the target memory element (208) is half-selected may also be affected by the resistive state of various unselected memory elements (236) and half-selected memory elements (232, 234) within the array (200). The sense current (214) flowing from the selected column line (202) while the target memory element (208) is half-selected is not relevant to the process of sensing the resistive state of the selected memory element (208). Thus, the electric current received while the memory element (208) is half-selected primarily includes what will be referred to as a noise current (230).

The magnitude of the noise current (230) is dependent upon the bias voltage (226) applied to the unselected rows (210). Specifically, the magnitude of the noise current (230) is dependent on the difference between the bias voltage (226) applied to the unselected row lines (210) and the read voltage (238) formed on the selected column line (202). Additionally, the magnitude of the noise current (230) is dependent on the equivalent resistance existing between the unselected row lines (210) and the selected column line (202). The bias voltages (226) are selected so that the noise current (230) is approximately equal to or less than the expected sense current (214). Reasons for this will be discussed in more detail below.

The noise current (230) from the selected column line (202) while the target memory element (208) is half-selected may be sensed, or measured, by a sense element (216). The noise current (230) sensed by the sense element (216) may be stored in a storage element (218). An example of a sense element (216) circuit will be discussed below in the text associated with FIG. 3. Likewise, an example of a storage element (218) circuit will be discussed below in the text associated with FIG. 4.

After the noise current (230) received from the selected column line (202) while the target memory element (208) is half-selected has been stored in the storage element (218), the target memory element (208) may be fully selected. The target memory element (208) becomes fully selected by applying a sense voltage (224) to the row line (204) connected to the target memory element (208). Various switching circuitry may be used to apply or remove the sense voltage (224) to a particular row line. By applying a sense voltage (224) to the selected row line (204) connected to the target memory element (208), a memory element current (228) will flow through the target memory element (208), through the select switch (212) and to the sense element (216). At this point, the sense current is a combination of the memory element current (228) and the noise current (230) which remains the same as when the target memory element (208) was only half-selected.

As mentioned above, it is desirable to read the electric current flowing through the selected memory element (208) that is a result of the sense voltage (224) only. Because the sense current (214) flowing from the selected column line (202) includes both the noise current (230) and the memory element current (208), a summing node (220) may be used to remove the noise current (230) stored in the storage element (218) from the sense current (214) received from the selected column line (202) when the memory element (208) is fully selected. The resulting output current (222) will thus be equivalent to the memory element current (228) only and not from various other sources.

Based on the value of the sense voltage (224) and the final output (222), the resistive state of the selected memory element (208) may be determined. For example, if the final output current (222) is a relatively low electric value, it may be determined that the selected memory element is in a high resistive state. Conversely, if the final output current (222) is a relatively high electric current value, then it may be determined that the selected memory element is in a low resistive state.

The summing node produces a more accurate output when the both of its inputs are relatively equal. Thus, the noise current (230) is manipulated to be roughly equal to the expected sense current (214) flowing from the selected column line (202) while the target memory element (208) is fully selected. As a result, the noise current (230) stored in the storage element (218) and the sense current (214) from the sense element (216) will be roughly equivalent. This produces a more accurate output current (222).

Figure 3:
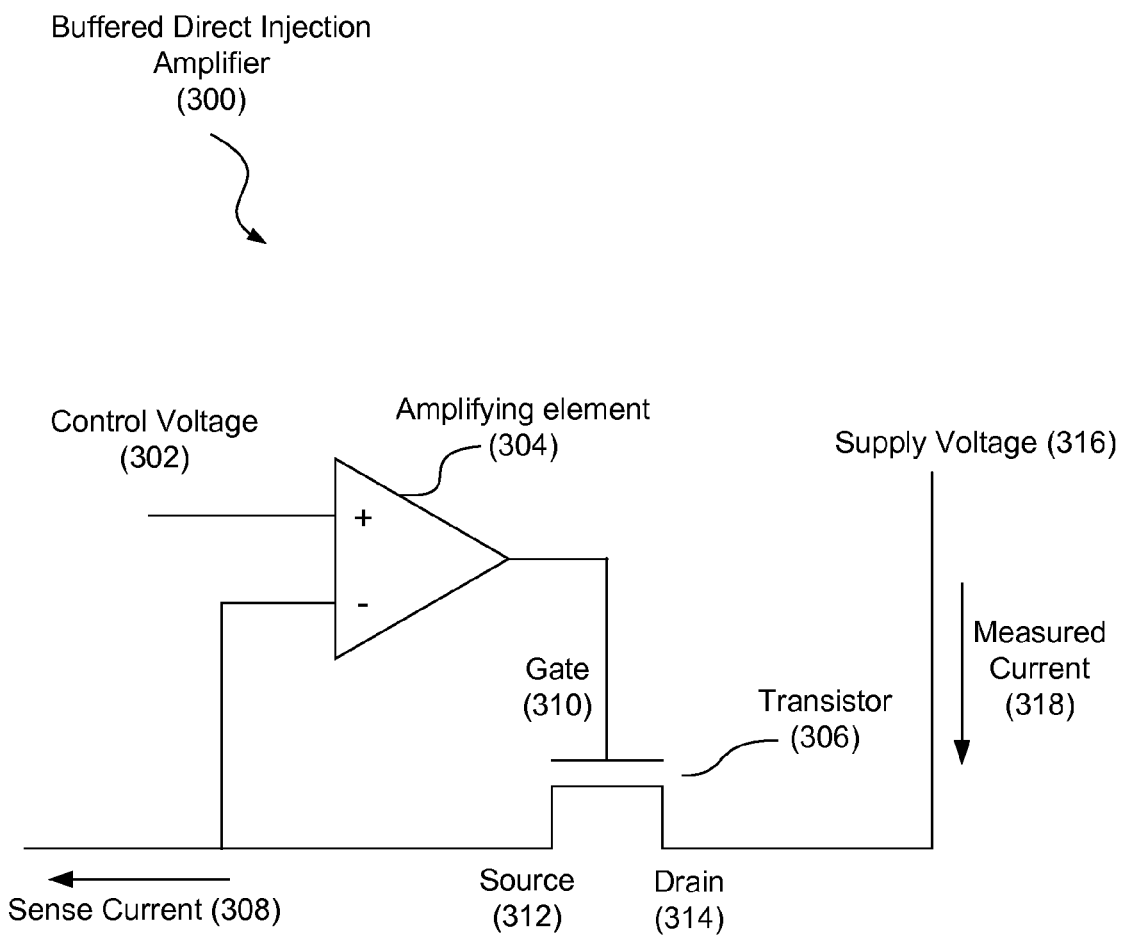
FIG. 3 is a diagram showing an illustrative Buffered Direct Injection (BDI) amplifier, according to one example of principles described herein.

FIG. 3 is a diagram showing an illustrative Buffered Direct Injection (BDI) amplifier (300). According to certain illustrative examples, a BDI amplifier may be used to sense the electric current received from a selected line. The BDI amplifier (300) may include a transistor (306) and an amplifying element (304) such as an operational amplifier. The BDI amplifier (300) is designed to accurately sense the electric current from a selected column line without adversely affecting the read voltage (e.g. 238, FIG. 2) formed on the selected line.

In some examples, a control voltage (302) may be applied to the positive input terminal of the amplifying element (304). The control voltage may be equivalent to the read voltage applied to the selected column connected to the target memory element (e.g. 208, FIG. 2). The negative input terminal of the amplifying element (304) may be connected to the drain terminal of the select switch (e.g. 212, FIG. 2) as part of a feedback loop coming from the output terminal of the amplifying element.

In the present configuration, the output terminal of the amplifying element (304) is connected to the gate terminal (310) of the transistor (306). The sense current (308) received from a selected line may pass through the transistor between the drain terminal (314) and the source terminal (312). The direction of the sense current is a matter of convention and may be based on the design implementation of the crossbar memory structure. For example, whether the bias voltages and sense voltages are positive or negative will affect the direction of the electric current flowing from a selected line.

A supply voltage (316) may be applied to the drain terminal (314) of the transistor (306). The measured electric current (318) may be read between the supply voltage (316) and the drain terminal (314). As mentioned above, if the measured current (318) is the noise current flowing from the selected column when the target memory element is only half-selected, then the measured current may be stored in a storage element. One type of storage element is a sample and hold circuit.

Figure 4A:
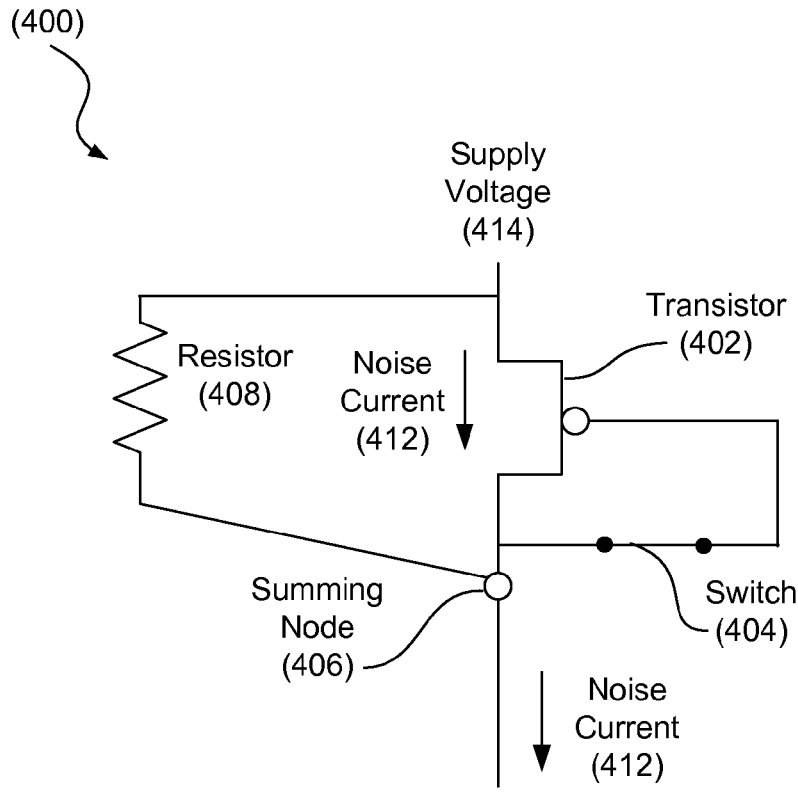
FIG. 4A is a diagram showing an illustrative sample and hold circuit in sample mode, according to one example of principles described herein.
Figure 4B:
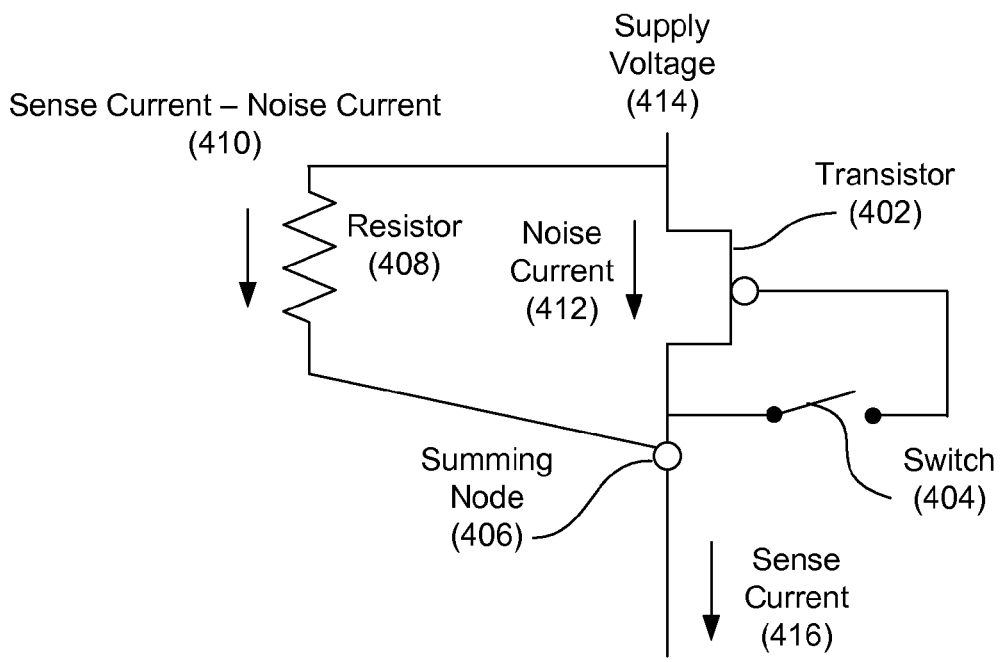
FIG. 4B is a diagram showing an illustrative sample and hold circuit in hold mode, according to one example of principles described herein.

FIGS. 4A and 4B are diagrams showing a sample and hold circuit (400) in correlation with a current mirror. A sample and hold circuit (400) is configured to operate in two modes. When the sample and hold circuit is in a sample mode, the output of the circuit is designed to match the input of the circuit. When the sample and hold circuit (400) is in a hold mode, the output is designed to output the value of the input at the moment the circuit is switched to hold mode. The sample and hold circuit (400) will ideally hold the same output value for the duration of the time in which the circuit is in hold mode.

FIG. 4A is a diagram showing an illustrative sample and hold circuit (400) in sample mode. The sample and hold circuit (400) may be in sample mode while a target memory element is only half-selected. While in sample mode, the switch (404) between the gate terminal and the drain terminal will be closed. While closed, the transistor is in an ON state and functions as a Metal Oxide Semiconductor (MOS) diode. Thus, electrical current is allowed to flow between the source terminal and the drain terminal of the transistor (402). The noise current (412) may flow from the supply voltage (414) and through the transistor (402). A small portion of the electric current may flow through the resistor (408). However, as appreciated by those skilled in the relevant art, the bulk of the electric current will flow along the path of least resistance. Thus, the electric current flowing through the resistor is negligible. As the noise current (412) is flowing through the transistor (402), a gate-to-source voltage is developed across the gate-to-source capacitance of the transistor (402).

FIG. 4B is a diagram showing an illustrative sample and hold circuit (400) in hold mode. The sample and hold circuit (400) may be switched to hold mode before the target memory element is fully selected. With the target memory element fully selected, the sense current (416) includes the noise current from the unselected memory elements as well as the memory element current from the selected target memory element. To switch to hold mode, the switch (404) between the gate terminal and the drain terminal of the transistor (402) may be opened.

With the switch opened, a portion of the sense current (416) will travel through the resistor (408). The voltage stored in the gate-to-source capacitance of the transistor will cause the drain current of the transistor to be equal to the noise current. In accordance with Kirchhoff's Current Law, the sense current (416) will be equal to the drain current of the transistor plus the current flowing through the resistor.

Since the transistor drain current is limited to be equal to the noise current and the current that must flow through the resistor (408) is the difference between the sense current and the noise current (410), the current through the resistor will be equal to the memory element current (228, FIG. 2). In this manner, the resistor (408) acts as a differential current sensor. The change in the voltage across the resistor will be a measure of the memory element current. Thus, the current (410) flowing through the resistor will be the sense current minus the noise current.

If the selected target memory element is in a low resistive state, a relatively large current will flow through the resistor (408). Conversely, if the target memory element is in a high resistive state, then a relatively small amount of current will flow through the resistor (408). The amount of current flowing through the resistor at this point is thus indicative of the resistive state of the selected target memory element.

The sense element and storage element examples illustrated in FIG. 3 and FIGS. 4A and 4B are merely one example of respective circuit configurations designed to carry out their described functions. As will be appreciated by those skilled in the relevant art, many other circuit configurations may be designed to accomplish the same functions.

Figure 5:
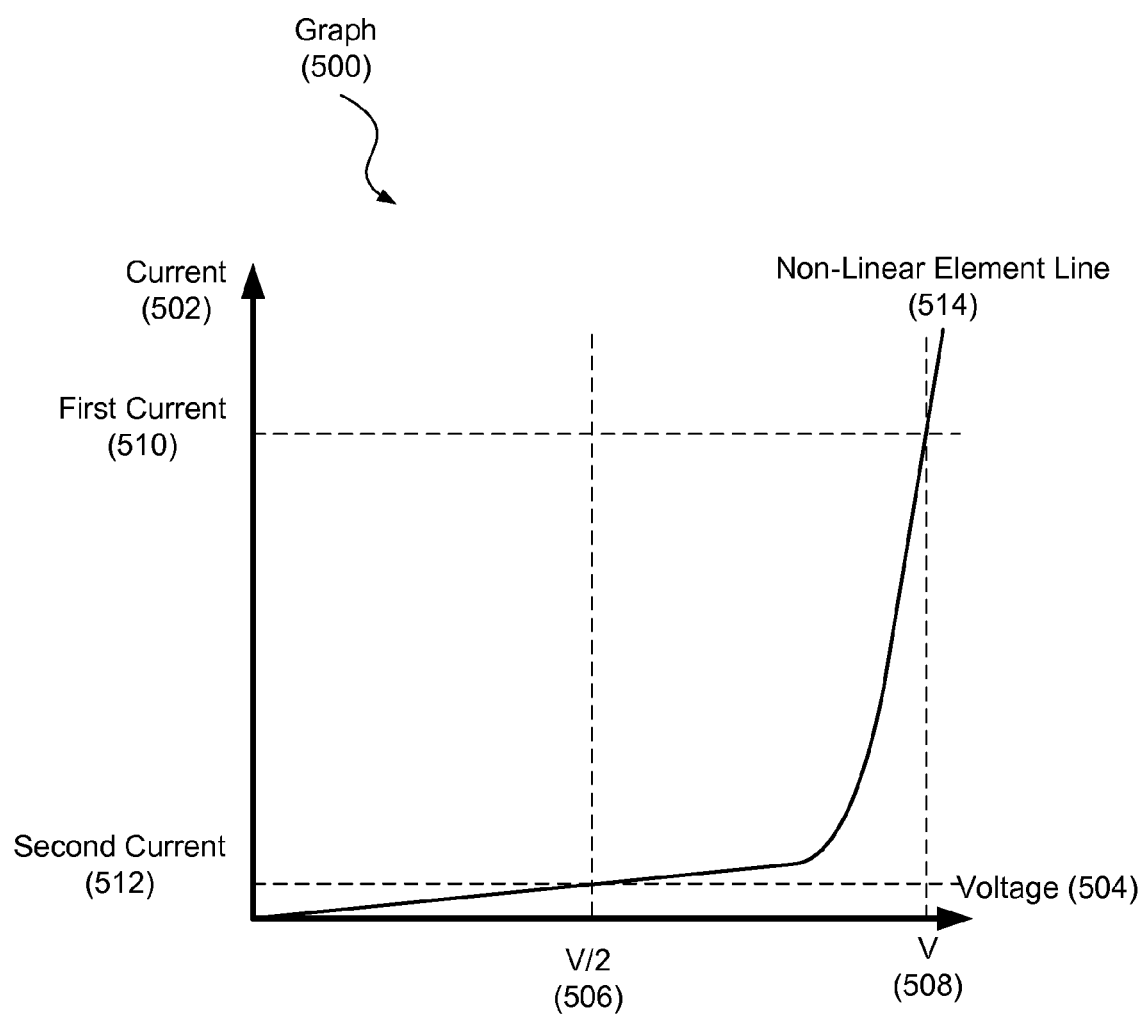
FIG. 5 is a diagram showing an illustrative voltage to current relation of a non-linear element, according to one example of principles described herein.

FIG. 5 is a graph (500) showing an illustrative voltage to current relation of a non-linear element. The horizontal axis of the graph (500) represents voltage (504) and the vertical axis of the graph (500) represents electric current (502). The non-linear element line (514) indicates the electric current (502) passing through a non-linear resistive element as a function of voltage (504).

According to certain illustrative examples, a voltage V (508) may be applied to a non-linear element. A first electric current (510) illustrated by the upper horizontal dotted line is the electric current value passing through the non-linear element with a voltage of V (508) applied. If half the voltage, V/2, (506) is applied, a second electric current (512) illustrated by the lower horizontal dotted line will flow through the non-linear element. The second current (512) will be much smaller than half the first electric current (510) flowing through the non-linear element when V (508) is applied. This non-linear relationship allows bias voltages to be applied to unselected lines within the crossbar array without overly affecting the electric current sensed from a selected memory element.

For example, if a sense voltage of V (504) is applied to a selected line and a bias voltage of V/2 (506) is applied to unselected lines, the cumulative electric currents from several unselected lines may still be less than the electric current flowing through the selected memory element as a result of sense voltage V (508) being applied.

Figure 6:
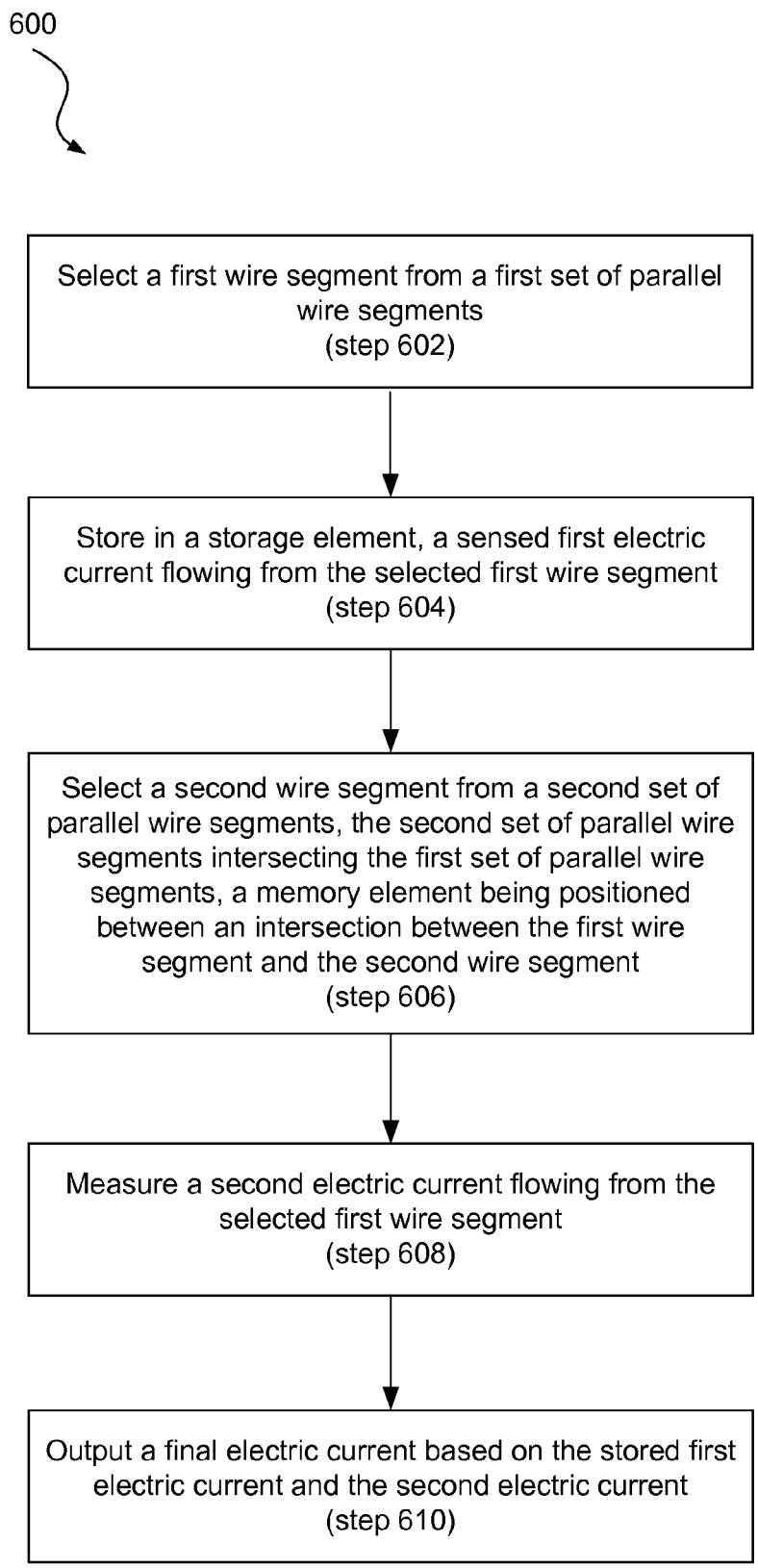
FIG. 6 is a flowchart showing an illustrative method for sensing the state of a memory element within a crossbar array, according to one example of principles described herein.

FIG. 6 is a flowchart showing an illustrative method (600) for sensing the state of a memory element within a crossbar array. According to certain illustrative examples, the method (600) may include selecting (step 602) a first wire segment from a first set of parallel wire segments; storing (step 604) in a storage element, a sensed first electric current flowing from the selected first wire segment; selecting (step 606) a second wire segment from a second set of parallel wire segments, the second set of parallel wire segments intersecting the first set of parallel wire segments, a memory element being positioned between an intersection between the first wire segment and the second wire segment; measuring (step 608) a second electric current flowing from the selected first wire segment; and outputting (step 610) a final electric current based on the stored first electric current and the second electric current.

In sum, a system or method embodying principles described herein allows the state of memory elements within a crossbar memory structure to be accurately read without the need of isolation elements. Thus, a memory structure having a higher density may be realized. Additionally, the cost of designing, implementing, and manufacturing such a memory structure may be reduced.

The preceding description has been presented only to illustrate and describe examples and examples of the principles described. This description is not intended to be exhaustive or to limit these principles to any precise form disclosed. Many modifications and variations are possible in light of the above teaching.

What is claimed is:

1. A method for reading memory elements within a crossbar memory array, the method comprising:
    storing a first electric current sensed from half-selected memory elements along a selected column line within said crossbar memory array, said first electric condition resulting from bias voltages applied to at least one row intersecting said selected column line; and
    selecting a target memory element connected to said selected column line by applying a sense voltage to a row line connected to said target memory element; and
    outputting a final electric current based on said stored first electric current and a second electric current sensed from said target memory element with said sense voltage applied.

2. The method of claim 1, in which said final electric current is a summation of said stored first electric current combined with said second electric current sensed from said memory element when said memory element is fully selected.

3. The method of claim 1, in which said final electric current is representative of a digital value based on a comparison of said first electric current and said second electric current.

4. The method of claim 1, in which said first electric current sensed from a half-selected memory element is stored with a sample and hold circuit.

5. The method of claim 4, in which said sample and hold circuit comprises a current mirror.

6. The method of claim 1, in which said memory element is a non-linear memory element.

7. The method of claim 1, in which at least one of said first electric current and said second electric current is sensed with a Buffered Direct Injection (BDI) amplifier.

8. A method for reading the state of memory elements within a crossbar memory array, the method comprising:
   selecting a column line from a first set of parallel lines;
   storing in a storage element, a sensed first electric current flowing from said selected column line, said first electric current resulting from a bias voltage applied to at least one row line from a second set of parallel lines intersecting said first set of parallel lines;
   selecting a row line from said second set of parallel lines, a target memory element being positioned between an intersection between said column line and said row line;
   measuring a second electric current flowing from said selected row line; and
   outputting a final electric current based on said stored first electric current and said second electric current.

9. The method of claim 8, in which said final electric current is a summation of said stored first electric current combined with said second electric current sensed from said selected column line when said target memory element is fully selected.

10. The method of claim 8, in which said storage element comprises a sample and hold circuit.

11. The method of claim 8, in which said target memory element is a memristor.

12. The method of claim 8, in which at least one of said first electric current and said second electric current is sensed with a Buffered Direct Injection (BDI) amplifier.

* * * * *